(12) United States Patent
Manzula

(10) Patent No.: US 11,304,314 B2
(45) Date of Patent: Apr. 12, 2022

(54) ELECTRONICS HOUSING AND METHOD FOR HOUSING ELECTRONIC COMPONENTS

(71) Applicant: Phoenix Contact GmbH & Co. KG, Blomberg (DE)

(72) Inventor: Evgenij Manzula, Bielefeld (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 16/495,878

(22) PCT Filed: Mar. 20, 2018

(86) PCT No.: PCT/EP2018/057019
§ 371 (c)(1),
(2) Date: Sep. 20, 2019

(87) PCT Pub. No.: WO2018/172356
PCT Pub. Date: Sep. 27, 2018

(65) Prior Publication Data
US 2020/0137897 A1    Apr. 30, 2020

(30) Foreign Application Priority Data
Mar. 21, 2017   (BE) .................................. 2017/5178

(51) Int. Cl.
*H05K 5/00* (2006.01)
*H05K 5/02* (2006.01)

(52) U.S. Cl.
CPC ......... *H05K 5/0008* (2013.01); *H05K 5/0217* (2013.01)

(58) Field of Classification Search
CPC .... H02G 3/081; F16B 25/0015; H05K 5/0008
USPC ................................................ 220/4.02, 4.33
See application file for complete search history.

(56) References Cited

U.S. PATENT DOCUMENTS 5,848,718 A * 12/1998 Colwell ................. H02G 3/081
220/4.02
6,050,765 A * 4/2000 McGovern .......... F16B 25/0015
411/387.2
2015/0004023 A1    1/2015 Heise

FOREIGN PATENT DOCUMENTS

| CN | 101098595 A | 1/2008 |
| CN | 201700108 U | 1/2011 |
| CN | 203081939 U | 7/2013 |
| DE | 3417161 A1 | 11/1984 |
| DE | 3701004 C1 | 12/1987 |
| DE | 8814890 U1 | 2/1989 |

(Continued)

*Primary Examiner* — Jeffrey R Allen
(74) *Attorney, Agent, or Firm* — Leydig, Voit & Mayer, Ltd.

(57) ABSTRACT

An electronics housing for housing electronic components includes: a lower housing part and an upper housing part connected to one another by connecting means in order to form a housing body, the connecting means having at least one screw which has a threaded section for thread formation. When the housing body is in a connected state, the threaded section of the screw is screwed through a connecting region of the upper housing part to form thread, and screwed into a connecting region of the lower housing part to form thread at least in sections, or vice versa. The connecting regions for the connection by the screw each have a screw section, between which a thread clearance is formed in a state of use.

15 Claims, 7 Drawing Sheets

(56) References Cited

FOREIGN PATENT DOCUMENTS

| | | |
|---|---:|---|
| DE | 29606194 U1 | 6/1996 |
| DE | 29920465 U1 | 1/2000 |
| DE | 19940950 A1 | 2/2001 |
| DE | 102005049816 A1 | 4/2007 |
| DE | 102007032510 A1 | 1/2009 |
| DE | 102008020099 B4 | 10/2010 |
| DE | 102009043177 A1 | 4/2011 |
| DE | 102012204526 A1 | 7/2013 |
| DE | 102014109970 A1 | 1/2016 |
| EP | 1494518 A1 | 1/2005 |
| JP | 2007327555 A | 12/2007 |

\* cited by examiner

ELECTRONICS HOUSING AND METHOD FOR HOUSING ELECTRONIC COMPONENTS

CROSS-REFERENCE TO PRIOR APPLICATIONS

This application is a U.S. National Phase application under 35 U.S.C. § 371 of International Application No. PCT/EP2018/057019, filed on Mar. 20, 2018, and claims benefit to Belgian Patent Application No. BE 2017/5178, filed on Mar. 21, 2017. The International Application was published in German on Sep. 27, 2018 as WO/2018/172356 under PCT Article 21(2).

FIELD

The invention relates to an electronics housing for housing electronic components, wherein a lower housing part and an upper housing part are connected to one another by connecting means in order to form a housing body. Furthermore, the invention relates to a method for encasing or for forming the electronics housing.

BACKGROUND

Electronics housings of the type in question are known from the prior art, for example DE 29606194 U1, in which a printed circuit board is arranged in the interior of an electronics housing, which circuit board in turn has electrical connections in order to be able to connect the electrical or electronic components on the printed circuit board for energy or signals.

Furthermore, electronics housings of the type in question are known from DE 29920465 U1, wherein cable feedthroughs are provided in the walls of the electronics housing in order to be able to introduce cables for the energy or signal connection of the printed circuit board into the interior of the electronics housing.

Furthermore, DE 10 2014 109 970 A1 discloses electronics housings of the type in question in which a lower housing part and an upper housing part are connected to one another by separate connecting means by bracing the lower housing part and an upper housing part against one another in order to form a housing body.

SUMMARY

In an embodiment, the present invention provides an electronics housing for housing electronic components, comprising: a lower housing part and an upper housing part connected to one another by connecting means in order to form a housing body, the connecting means having at least one screw which has a threaded section configured and designed for thread formation, wherein, when the housing body is in a connected state, the threaded section of the screw is screwed through a connecting region of the upper housing part to form thread, and screwed into a connecting region of the lower housing part to form thread at least in sections, or vice versa, and wherein the connecting regions, for the connection by the screw, each have a screw section, between which a thread clearance is formed in a state of use.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
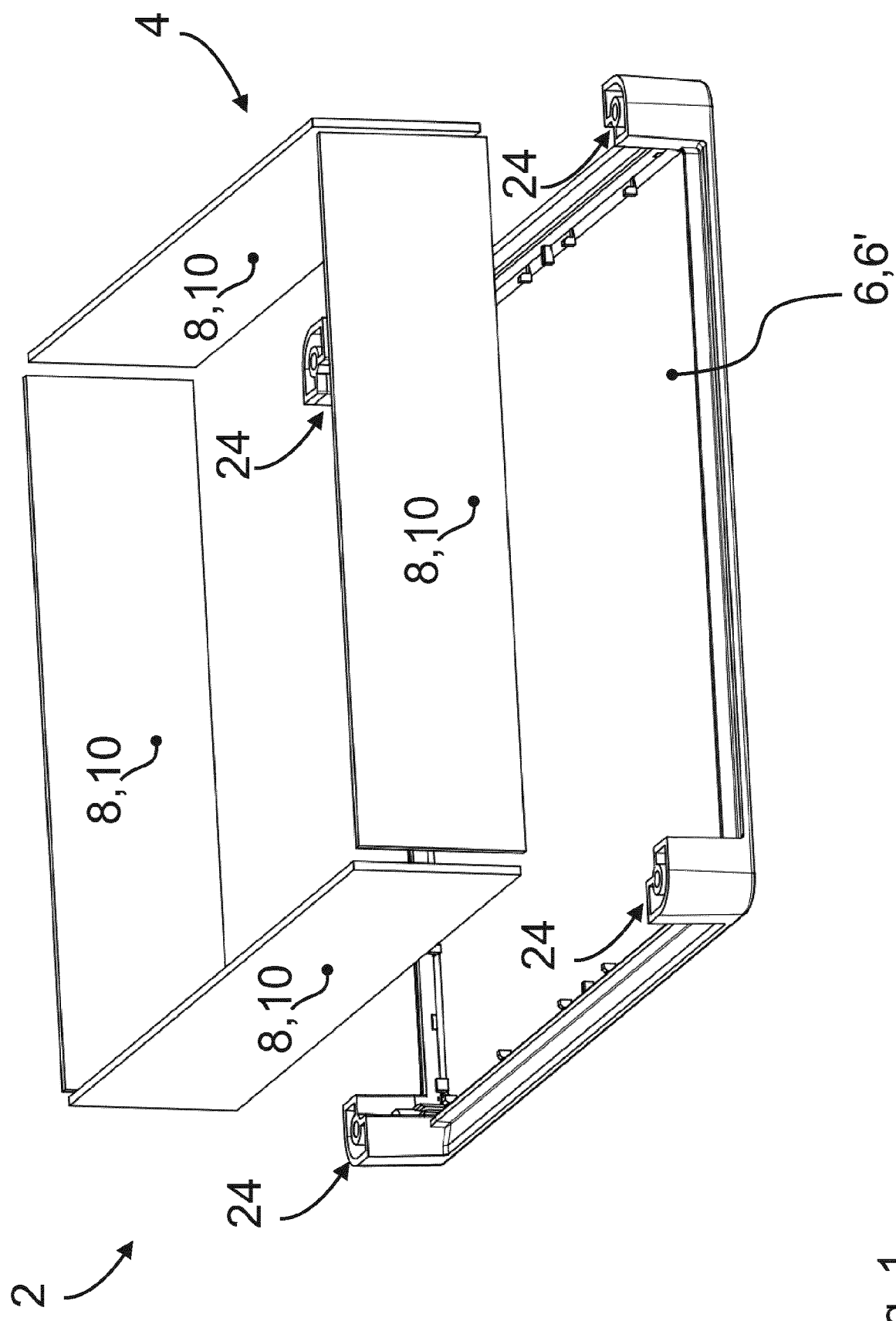
FIG. 1 shows the lower housing part with side walls of the exemplary embodiment of an electronics housing according to the invention in a perspective view in a schematic representation.

The present invention simplifies the production of an electronics housing of the type in question, to make it safe, and also achieve cost savings.

The invention distances itself from the idea of achieving savings by using economical materials in order to solve the posed object. Further, the invention distances itself from the idea of achieving savings by minimizing the number of parts in order to thereby reduce manufacturing costs.

Rather, according to the invention at least one screw connection is provided in order to form a housing body which serves for housing electronic components.

Against this background, the connecting means in an electronics housing according to the invention have at least one screw which in turn has a threaded section configured and designed for forming thread.

Furthermore, the invention provides that, when the housing body is in a connected state, the threaded section of the screw is screwed through a connecting region of the upper housing part to form thread, and screwed into a connecting region of the lower housing part to form thread at least in sections.

In so doing, the invention includes that the lower housing part and the upper housing part are designed and configured in such a way that the screw for connecting the lower housing part and the upper housing part is optionally screwed through the connecting region of the upper housing part and screwed into the connecting region of the lower housing part, or vice versa. Thus, within the scope of the invention, it is likewise possible for the screw for connecting the lower housing part and the upper housing part to be screwed through the connecting region of the lower housing body and screwed into the connecting region of the upper housing part.

In this respect, an advantage of an electronics housing according to the invention is that there is no preferred direction for the at least one screw, in which it is inserted into the mutually corresponding connecting regions of the housing parts (upper housing part, lower housing part) in order to connect them.

Furthermore, the term housing part is used for short for the upper housing part or lower housing part.

When using a plurality of screws, they can also be arranged differently from one another on the housing body, so that, for example when two screws are used when the housing body is in a connected state, the threaded section of one of the screws is screwed through the connecting region of the upper housing part to form thread, and screwed into the connecting region of the lower housing part to form thread at least in sections, whereas the other screw is screwed through the connecting region of the lower housing part to form thread and screwed into the connecting region of the upper housing part to form thread at least in sections. Furthermore, it is possible for both screws to be inserted into the connecting regions in the same direction or alignment relative to each other when in a connected state.

Within the scope of the invention, the term "screwed in" is to be understood in particular as meaning a state of the screw in which the threaded section of the screw cooperates with the thread formed in the relevant connecting region at least in sections in order to hold the housing parts against each other.

In the context of the invention, a connected state is to be understood as meaning a state of the housing body in which the housing body is designed to be configured to house the electronic components by the arrangement of the upper housing part and the lower housing part relative to one another and their connection to one another by means of the at least one screw.

Furthermore, within the scope of the invention, a connecting region is to be understood as a respective section which is provided on the lower housing part or upper housing part to form thread by the screw in order to be able to connect the lower housing part and the upper housing part to one another by means of a screw connection and hold them together. For a screw connection of the housing parts by means of the at least one screw, the connecting region of the lower housing part and the connecting region of the upper housing part corresponding thereto are therefore arranged relative to one another and are aligned such that the screw can be inserted into the connecting regions.

When identifying and describing the features of an electronics housing according to the invention, a connected state is assumed, wherein deviations therefrom are correspondingly described/identified or result from the particular context.

The invention yields the advantage that a reduction in the costs of producing an electronics housing according to the invention is achieved inter alia in that a connection between the upper housing part and the lower housing part is realized by means of at least one screw which is screwed both through the upper housing part as well as into the lower housing part, wherein the screw for producing a connection is optionally first screwed through the relevant connecting region of the lower housing part and then screwed into that of the upper housing part (or in reverse order) while producing a thread in order to realize a secure hold of the lower housing part and the upper housing part against each other to form the housing body. The effort for aligning the housing parts arranged relative to one another to form the housing body can thus be reduced, resulting in handling and assembly/disassembly advantages. This contributes to low production costs.

Furthermore, as stated above, the invention makes it possible to use a high proportion of identical parts, as a result of which a lower cost level is also realized. Identical housing body parts as well as screws of the same type can thus, for example, contribute to cost savings.

In addition, it is advantageously achieved by the invention that a simple and likewise reliable and play-free connection of the lower housing part and upper housing part can be realized.

Furthermore, the invention yields the advantage that, in order to simplify assembly/disassembly, the screw, by being inserted into one of the connecting regions of one of the housing parts, is captively held in this housing part.

Furthermore, additional components, such as a nut, are dispensed with for connecting the housing parts of an electronics housing according to the invention by means of the at least one screw. This in turn results in simple handling of the electronics housing formed according to the invention during its assembly and disassembly.

Furthermore, the use of a screw connection results in a highly reliable connection (even in the case of dynamic loads) and good recycling properties in addition to cost advantages. In addition, a self-locking effect is achieved according to the invention by screwing a screw into the respective housing parts, which promotes a secure connection and likewise simplifies the assembly and disassembly of an electronics housing according to the invention.

According to the invention, a connecting region can be designed in various ways. It is accordingly inter alia possible for the connecting region to have a material or a material composition which is different from the material/material composition of the remaining region of the lower housing part or upper housing part and is softer, for example, for correspondingly screwing in or through.

In order to facilitate the screwing process, the invention also comprises the screw being configured and designed such that the threaded section has a greater strength and/or hardness compared to the connecting region of the upper housing part and/or the lower housing part at least in sections, in particular with its region facing a free end of the screw.

Furthermore, within the scope of the invention, it is possible to select a broad spectrum of usable materials.

According to the invention, for example, at least one of the connecting regions or the upper housing part and/or the lower housing part can consist of an electrically insulating material or a plastic, a non-metallic material, a composite material and also of a biomaterial (e.g. so-called liquid wood). Thus, for example, the housing body can advantageously be formed in an electrically insulating, lightweight and cost-effective manner.

Furthermore, according to the invention, the screw can consist at least in sections, for example, of a metal, for example a steel or a non-ferrous metal, such as titanium, aluminum, as well as a plastic or composite. As a result, it is advantageously possible to achieve a highly reliable connection.

Within the scope of the invention, the term "electronic component" covers an electrical/electronic component, an assembly consisting of electrical/electronic components, and also a combination of electronic components, such as a populated printed circuit board.

An electronics housing according to the invention can in particular be designed to accommodate a printed circuit board (also referred to as a circuit board) with which, for example, an electronic computer device, for example a so-called "single-board computer," is realized. In the case of such a single-board computer, a computer device is completely accommodated on a single circuit board which can be housed according to the invention by the housing body in order to thus provide a computer device of compact design.

The advantage resulting from a correspondingly formed screw according to the invention lies inter alia in that stringent requirements are not imposed on their implementation or on their choice of materials.

In order to form thread in a relevant connecting region, it is therefore provided within the scope of the invention that the screw material is matched to the material of the relevant connecting region or connecting regions such that the screw has a higher strength in comparison to the relevant connecting region in order to be able to form thread in a correspondingly reliable manner.

It is also possible to dispense with further measures which arise, for example, by creating the thread using various tools.

In order to facilitate the screwing process for inserting the screw into one of the above-mentioned connecting regions, it is provided in a further advantageous invention that at least one of the connecting regions has a hole, in particular a through-hole, the hole being designed and configured and thus dimensioned and designed to match the screw such that the threaded section forms a thread at least partially in a hole wall of the hole when the screw is inserted into the hole.

Within the scope of the invention, as already mentioned above, the insertion of the screw into a connecting region is preferably achieved by a screwing process in which a rotation of the screw in cooperation between the threaded section and the relevant connecting region produces a thread in the connecting region, wherein the screw also executes a translational movement as a result of the rotational movement.

In this respect, in the context of the invention, inserting a screw into a connecting region includes that the screw penetrates or is screwed into the connecting region and is thus arranged only in sections, preferably at least in sections, with its threaded section in the connecting region. Within the scope of the invention, the term "insertion" also includes that, given a connecting region with a correspondingly soft design, the screw can be arranged in the connecting regions by purely translational movement under the effect of a compressive force on the screw.

According to the invention, the use of a hole, which is designed, for example, as a core hole for the screw, makes it possible to carry out the screwing process in a simplified manner. Furthermore, it is thereby achieved that the risk of crack formation in the relevant connecting region or the associated housing part is reduced.

In the context of the invention, the hole can also be designed as a blind hole; however, in the context of the invention, a design as a through-hole is preferred, inter alia in order to avoid crack formation and an optional insertion of the screw into the relevant connecting region as described.

According to the invention, it is taken into account that the thread does not have to be formed completely circumferentially in the hole. In the context of the invention, it is likewise sufficient for the thread to be formed only partially circumferentially or in a partial section of the hole.

According to the invention, the circumference of the hole is in relation to the hole axis along which the hole is longitudinally extended and along which the screw is screwed through/into the hole.

Accordingly, a partial circumferential formation of the thread in the hole refers to a part of the circumference as it exists in the manner described above.

Consequently, the circumference relative to the screw results in relation to the screw axis, along which the screw is longitudinally extended between its two free ends.

The formation of a thread in the connecting region can be achieved in various ways within the scope of the invention. For example, it is possible to design the threaded section of the screw as a thread cutter so that the thread formation in the relevant connecting region of the respective housing part is produced by a cutting process.

This has the advantage that the thread formation is made possible by low exertion of force. However, this solution has the disadvantage that chips may arise which must be correspondingly removed and eliminated.

In order to avoid these chips, a further advantageous development of the invention provides that the screw is configured and designed in such a way that the threaded section is configured and designed, at least in sections, to form thread.

In addition to avoiding chips, this advantageously achieves that material loss is avoided, the screw has less wear when forming thread, and the demands on the threaded section are lower than a previously mentioned variant of the threaded section.

Furthermore, there is the advantage that a more precise shaping of the thread is made possible by the thread formation.

In order to form thread, it has proven to be advantageous within the scope of the invention to provide a hole in at least one of the relevant connecting regions, preferably both connecting regions. As a result, it is possible to reduce the risk of crack formation during the thread formation.

A screw can be implemented in various ways within the scope of the invention. Thus, for example, a cylinder screw can be used, on one free end of which a threaded section is arranged and on the remaining free end of which a screw head (e.g. flat head, hexagon (socket), countersunk, round and oval head shape, . . . ) is formed, which is configured and designed for actuating the screw for realizing its rotational movement for the screwing process.

According to the invention, the screw with its threaded section is first screwed through a connecting region of the upper housing part or the lower housing part in order then to be screwed into the corresponding connecting region of the lower housing part or upper housing part in order to connect the housing parts to one another.

The screw penetrates the connecting region of the housing part, through which the threaded section of the screw is screwed, while being screwed into the connecting region of the remaining housing part for a secure connection of the housing parts to one another.

Screwing into the lower housing part (or into the upper housing part) causes the lower housing part and the upper housing part to be securely held together by the screwing action and also meets requirements for protection against the penetration by foreign bodies or fluids, possibly using sealing means, in a simple manner.

In order to facilitate the screw connection, a further advantageous development of the invention provides that the screw has a screw shank formed between a screw head and the threaded section, the outer diameter of which is less than a nominal diameter, in particular less than an edge diameter, preferably less than a core diameter, of the threaded section of the screw.

Another advantageous development of the invention provides that the screw shank has a length which is equal to or greater than a screwed-through section of the connecting region for the screw. The length of the screw shank according to the invention is measured in a direction in which the screw shank extends between the free ends of the screw.

In the context of the invention, the screwed-through section is the section of the connecting region along which the screw forms a thread in the manner described above, after the threaded section of the screw has passed through this section or is screwed through the connecting region along this section in order to achieve a connection between the housing parts.

The above-mentioned development of the invention leads to the advantage of facilitating the screwing process or the thread formation.

A further simplification of thread formation is achieved by means of a further advantageous development of the invention in that the threaded section tapers toward the free end of the screw so that the diameter is correspondingly reduced. In this case, a tip can be formed at a free end of the screw, by means of which a further simplification of thread formation can be achieved.

A further advantageous development of the invention relates to the fact that the housing body, in particular the upper housing part and/or the lower housing part, consists at least in sections of an electrically insulating material, or of a plastic, or of a material having plastic. It is thereby possible according to the invention to produce a housing body of an electronics housing according to the invention by an injection molding method as an inexpensive mass-produced product or as a serial part.

The use of a plastic offers various advantages. In addition to cost-effective production, advantages also result, inter alia, from insulating properties and also from a good balance between the weight and load-bearing capacity of the plastic.

Within the scope of the invention, an advantageous development includes forming the upper housing part and/or the lower housing part integrally, in particular in one piece, which results in advantages in the handling as well as in the production of an electronics housing according to the invention.

Side walls which delimit the interior of the housing body in the circumferential direction are formed between the upper housing part and the lower housing part, or the housing cover and the housing base. The circumferential direction results, in particular, along an outer edge of the upper/lower housing part, by which said part(s) is/are delimited. The side walls thus form a frame, wherein the upper housing part or the lower housing part forms a housing base or a housing cover.

The side walls can be formed, for example and in particular, by individual parts or side elements and can moreover also be formed on at least one upper housing part or lower housing part.

In an extremely easy manner, a housing body of an electronics housing according to the invention is therefore produced by the upper housing part and the lower housing part, which, arranged relative to one another, likewise form the aforementioned side walls. It is also provided within the scope of the invention that the housing body is configured and designed in a modular manner so that inter alia optional elements can be arranged thereon. Furthermore, equipping with electronic components can be accomplished in a modular manner.

Furthermore, it is provided within the scope of the invention that the passage of electrical conductors or cables is made possible by feed-through openings so that the electronic components located within the interior of the housing body can be connected for or supplied with energy or signals.

A further advantageous development of the invention provides that the housing body has a shape symmetrical, at least in sections, to at least one plane.

This yields the advantage of further simplified handling of an electronics housing according to the invention.

It is likewise provided within the scope of the invention that the upper housing part and the lower housing part are identically shaped. This yields the advantage that the housing parts can be produced as identical parts, which in turn results in advantages in storage and production. This also leads to cost advantages in development and production.

According to the invention, the upper housing part and the lower housing part can therefore consist of two identical parts, whereby the number of variants of necessary components for forming an electronics housing according to the invention can be kept low. For this purpose, it is provided in a corresponding further developed invention that the upper housing part and the lower housing part are shaped in the same way, in particular alike, preferably identically.

The invention encompasses various embodiments and types of use of an electronics housing formed according to the invention. It can thus be configured and designed for wall/ceiling/floor attachment, or be positioned in some other way. Furthermore, it is possible to arrange an electronics housing according to the invention on a reference surface by holding means. Accordingly, a housing according to the invention can be positioned, for example, by a wall fastener, a foot, VESA holder, VESA foot, etc. However, the invention is not limited thereto.

In order to simplify the use of an electronics housing according to the invention, it is provided in a further advantageous development of the invention that the housing body is configured and designed for mounting on a support rail. This affords the advantage of simplified installation and removal of an electronics housing according to the invention, and its use, for example, in a switchgear cabinet.

Furthermore, this makes it possible to arrange an electronics housing according to the invention at predetermined places without requiring special effort to align or attach it, which results in time and cost advantages. This yields improved manageability of an electronics housing according to the invention.

A further advantageous development of the invention relates to the fact that the connecting regions corresponding to one another for connecting the upper housing part and the lower housing part each have a side which face one another in the connected state and between which a thread clearance is formed.

Within the scope of the invention, the sides which face each other in the connected state refer to those which are penetrated by the screw head for thread formation.

In the context of the invention, a thread clearance is characterized in that the screw does not form a thread in the thread clearance so that it does not have a thread formed by the screw even in the connected state.

This has the advantage that deformation stresses are avoided when the housing parts are connected by the at least one screw. This is achieved according to the invention by preventing the threaded section of the screw from being located simultaneously in both connecting regions. As an advantageous further effect, the thread formed by the screw is also not unnecessarily stressed or deformed.

In order to simplify handling, it is provided in a further advantageous development of the invention that a distance between the threaded forming portions of the mutually corresponding connecting regions is greater than or equal to the length of the threaded section of the screw. This distance also determines the size of the thread clearance.

This leads to the advantage that the screw can be held captively on the upper housing part or on the lower housing part. This yields a simplification of the assembly and disassembly of an electronics housing according to the invention without the need for further auxiliary means.

The invention further comprises a method for housing electronic components by means of an electronics housing, wherein the features described above can form an electronics housing according to the invention in any combination with one another.

A method according to the invention includes features such as have already been mentioned above, and a repetition of these features as components of a method according to the invention is therefore omitted. The previous embodiments accordingly also analogously apply to a method according to the invention.

One method according to the invention provides inter alia that, in order to form a housing body, a lower housing part and an upper housing part are connected to one another by connecting means.

The connecting means have at least one screw, the thread-forming threaded section of which is first screwed through a connecting region of the upper housing part to form thread and thereupon screwed into a connecting region of the lower housing part to form thread at least in sections.

Furthermore, a method according to the invention comprises first screwing the at least one screw through a connecting region of the lower housing part to form thread, and then screwing it into a connecting region of the upper housing part to form thread at least in sections.

When using a plurality of screws, that which was previously described with reference to an electronics housing according to the invention accordingly also applies to a method according to the invention.

In addition to the advantages mentioned above, the method leads to the fact that the assembly steps for connecting the upper housing part and the lower housing part to one another can be kept simple and few.

An advantageous development of a method according to the invention provides that the screw, the thread-forming threaded section of which is designed at least in sections to be thread-forming is screwed into a hole of at least one connecting region.

The corresponding advantages already mentioned thus also result analogously for a method according to the invention. Therefore, the further features for forming the thread in the hole are correspondingly transferable from that described above.

The invention is explained in more detail below with reference to the attached drawing, in which an exemplary embodiment of an electronics housing according to the invention, which is also used to illustrate a method according to the invention, is shown as a representative of a plurality of electronics housings according to the invention.

The figures in the drawing show a possible exemplary embodiment of an electronics housing according to the invention in a schematic representation in each case. The illustrations in the figures are therefore in particular not necessarily to scale in relation to each other and for a better overview are reduced to the elements/parts/components promoting understanding.

In the figures, identical or corresponding parts/components or elements are provided with the same reference signs.

For a better overview, all elements/parts/components are not always provided with reference signs in the figures, wherein the assignment results from the same representation or a representation adapted to the view.

In the case of the same or a similar structure, the description is reduced below to the differences between the exemplary embodiments or figures for a better overview.

In this respect, the details of the exemplary embodiment shown in the figures of an electronics housing according to the invention also complement each other so that the relevant details also apply overall in a corresponding or analogous manner to further electronics housings formed according to the invention.

The exemplary embodiment of an electronics housing according to the invention is also abbreviated below by the term "electronics housing."

FIG. 1 shows the electronics housing 2 with its housing body 4 in a perspective view in a less detailed representation, wherein the representation addresses the lower housing part 6 with side walls 8 (uniformly identified by reference sign 8).

In this case, a first method step for producing the housing body 4 is shown, wherein side elements 10 (uniformly identified by reference sign 10) are provided for forming the side walls 8 of the housing body 4.

The side elements 10 are already aligned with one another in FIG. 1 to be arranged on the lower housing part 6.

In this exemplary embodiment of an electronics housing 2 according to the invention, the side elements 10 are identically designed. However, they can also be replaced individually by side elements 10 designed differently therefrom.

Within the scope of the invention, it is likewise possible for the side walls 8 to be formed on the lower housing part 6 or on the upper housing part 12 so that the housing body 4 can be produced by an upper housing part 12 and a lower housing part 6 arranged thereon, which are connected to one another by a screw connection (explained below).

Figure 2:
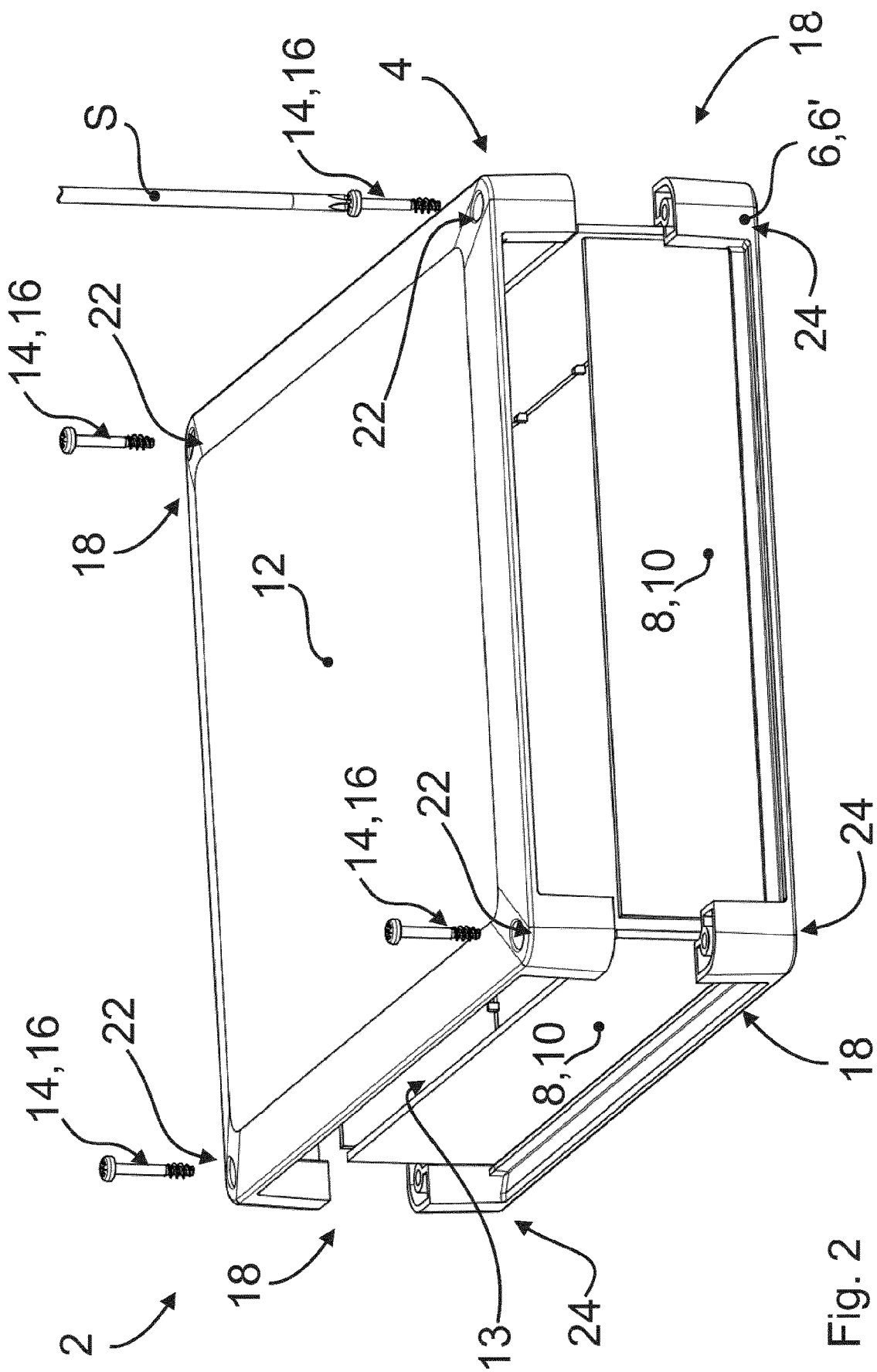
FIG. 2 shows the exemplary embodiment of an electronics housing according to the invention in an identical perspective view and type of representation, but in a different proportion to the illustration in FIG. 1, wherein besides the components shown therein, sections of the upper housing part as well as the screws for the screw connection and a schematically represented screwdriver are shown.

FIG. 2 shows the electronics housing 2 and illustrates a further method step for forming a housing body 4 in which the side elements 10 are arranged on the lower housing part 6, and the upper housing part 12 is supplied to and arranged on the lower housing part 6 with the side elements 10 located thereon.

In principle, the arrangement can also be carried out vice versa so that first the side elements 10 are supplied to the upper housing part 12, and then the lower housing part 6 is supplied to the upper housing part 12.

The lower housing part 6 and the upper housing part 12 of the housing body 4 are connected to each other by connecting means 14 in a connected state in which the housing body 4 is configured and designed to house electronic components.

In the exemplary embodiment shown, the connecting means 14 have a plurality of screws 16 which are uniformly provided with reference sign 16.

In a connected state, one screw 16 is arranged in a respective corner region 18 (uniformly identified by reference sign 18) of the housing body 4 so that, in the exemplary embodiment shown of an electronics housing according to the invention, four screws 16 are used to connect the upper housing part 12 and the lower housing part 6 to one another and thus hold them together.

The respective screw 16 has a threaded section 20 (uniformly identified by reference sign 20) which is configured and designed to form thread in order to produce a thread (explained below with reference to reference sign 30) in the relevant connecting region 22 of the upper housing part 12 and the lower threaded part 6.

The screws 16 used for this purpose are of the same screw type in the exemplary embodiment shown of an electronics housing 2 according to the invention, but the invention is not limited thereto. Different types of screws can also be used. The screws 16 of the screw type used are explained further with reference to FIG. 6.

When the housing body 4 is in a connected state, the threaded section 20 of the respective screw 16 is screwed through a connecting region 22 of the upper housing part 12 to form thread, and screwed into a relevant connecting region 24 (uniformly identified by reference sign 24) of the lower housing part 6 to form thread at least in sections.

Figure 4:
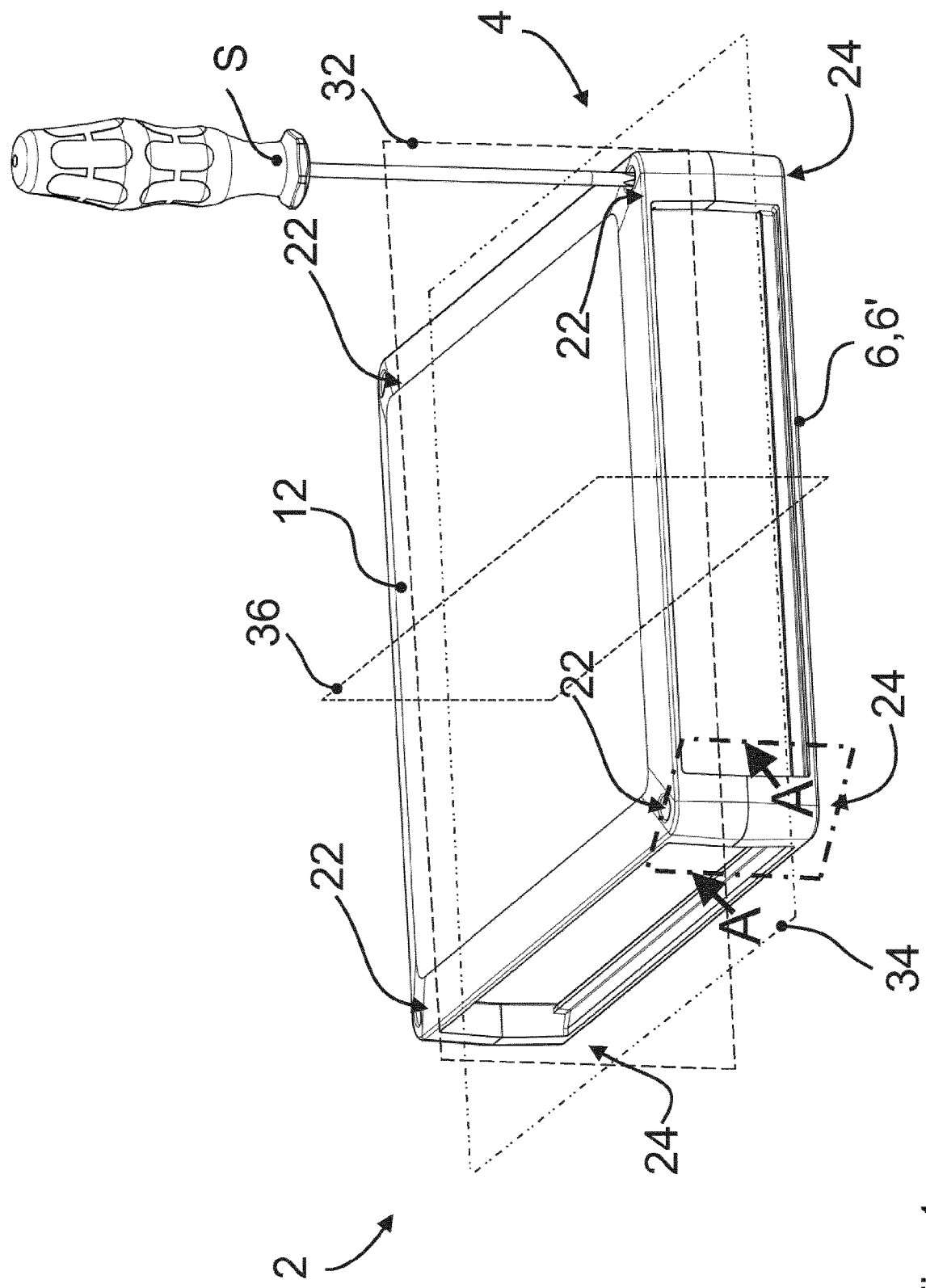
FIG. 4 shows the exemplary embodiment of an electronics housing according to the invention in a perspective view in the same type of representation as in FIG. 1 in order to clarify the screwing-in process.

This can be achieved by means of a commercially available screwdriver S, a section of which is shown in FIG. 2, and which can be better seen in FIG. 4.

Figure 3:
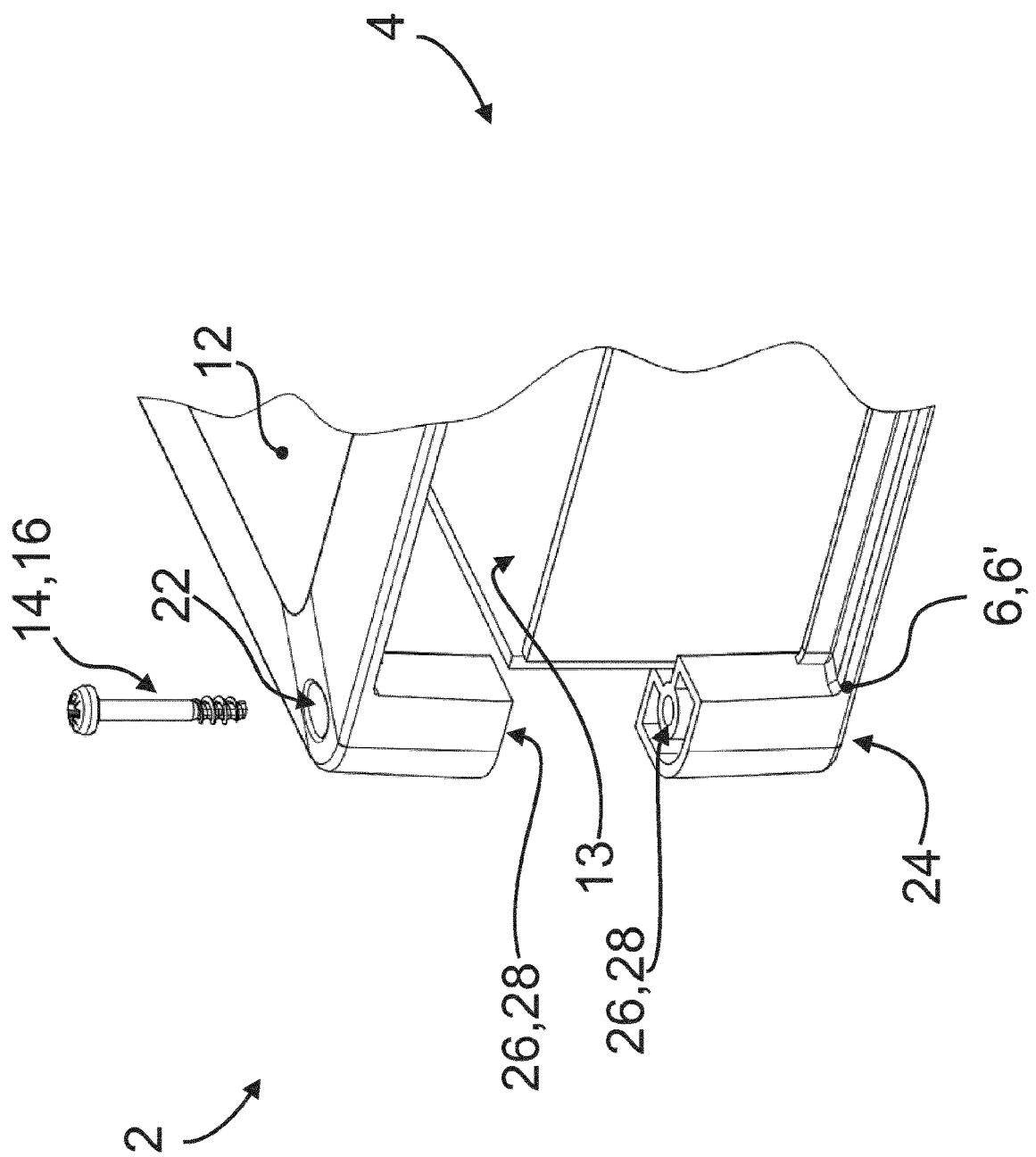
FIG. 3 shows the exemplary embodiment of an electronics housing according to the invention in a perspective view in the same type of representation as in FIG. 1, wherein the illustration refers to one of the housing corner regions of the housing body.

FIG. 3 shows the electronics housing 2 in a perspective view in the same type of representation as in FIG. 1, wherein the representation refers to one of the corner regions 18 of the housing body 4.

The upper housing part 12 is connected to the lower housing part 6 by means of the screws 16 which each penetrate a connecting region 22, wherein the respective screws 16 are screwed into the relevant connecting region 24.

For this purpose, the upper housing part 12 and the lower housing part 6 are arranged with respect to one another such that a connecting region 22 is correspondingly arranged to a connecting region 24 in order to insert a screw 16 into the mutually associated connecting regions 22, 24 and thereby connect the upper housing part 12 and the lower housing part 6 to one another.

Each of the connecting regions 22, 24 has a hole 26 (uniformly identified by reference sign 26) for thread formation, which hole is formed as a through-hole 28 (uniformly identified by reference sign 28). Thread formation in the respective hole 26 is illustrated and explained with reference to FIG. 5.

FIG. 4 illustrates a further method step in which the screws 16 are screwed into the upper housing part 12 and the lower housing part 6 to form thread. FIG. 4 also illustrates a connected state as described above.

The housing body 4 consists of a plastic which, in addition to sufficient protection of the electronic components arranged in the interior 13, also has an electrically insulating protective effect against external influences.

Furthermore, the housing body 4 is shaped to be symmetrical to three planes 34, 36, 38 which are aligned perpendicularly to one another.

In addition to the side elements 10, the upper housing part 12 and the lower housing part 6 are also shaped as identical parts. In this exemplary embodiment of an electronics housing 2 according to the invention, they are identically shaped which yields cost savings in production and storage and also achieves simplified handling during installation and removal.

The upper housing part 12 and the lower housing part 6 each form a side part of the housing body 4, wherein the upper housing part 12 forms a housing cover 12' and the lower housing part 6 forms a housing base 6', between which the side elements 10 are arranged.

Figure 5:
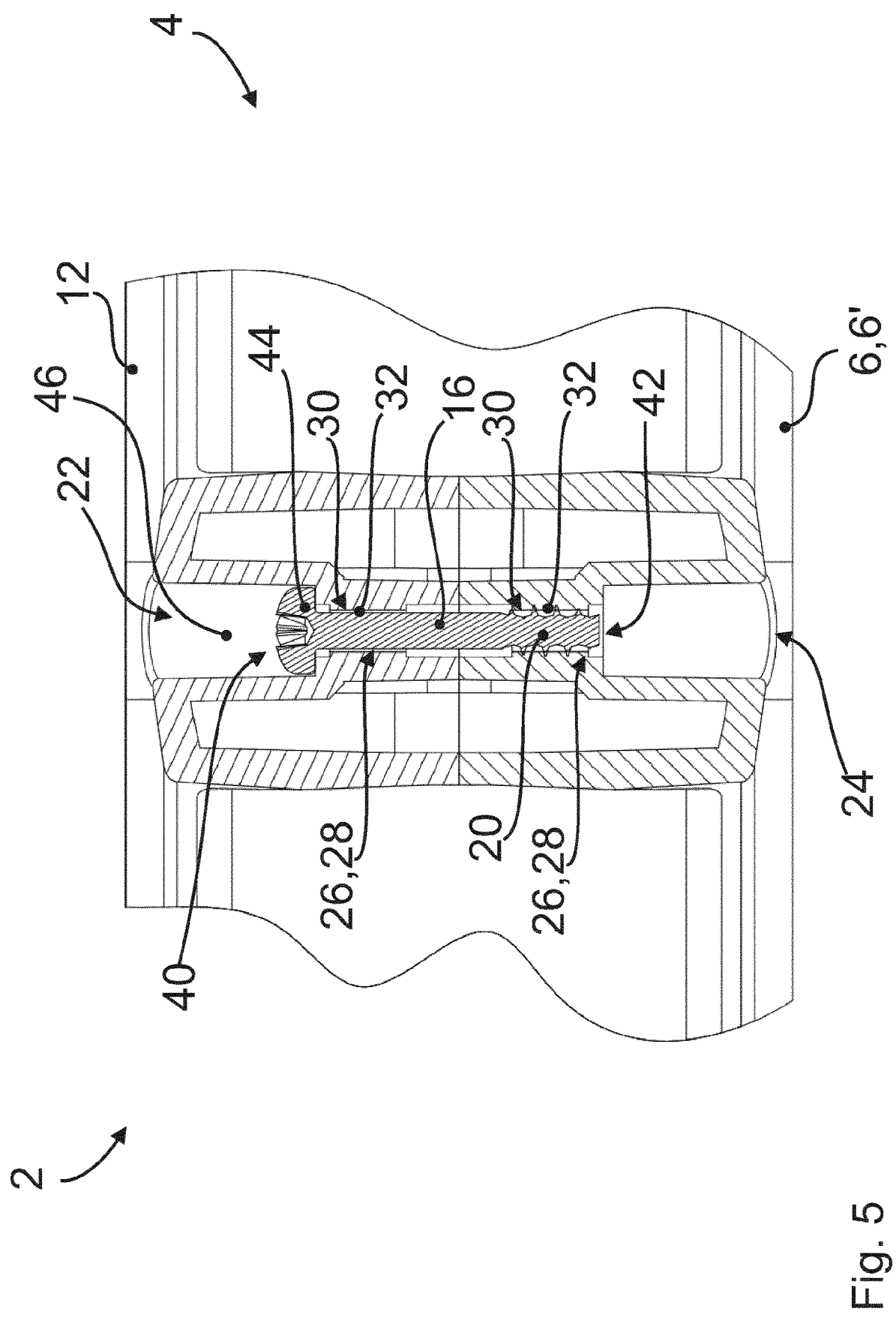
FIG. 5 shows a section of a connecting region of the upper part and lower part of the electronics housing designated by A-A in FIG. 4, otherwise of the same type of representation as in FIG. 1 but in a different proportion to the representation in FIG. 1.

FIG. 5 illustrates the arrangement of the screw 16 in the holes 26 of the lower/upper housing parts 6, 12 associated with each other for the screw connection. Furthermore, the representation in FIG. 5 illustrates a method section for forming a thread 30 by means of the screw 16.

In order to simplify the production of a screw connection or to produce a thread 30 in the relevant connecting region 22, 24, each of the connecting regions 22, 24 has a hole 26 (uniformly identified by reference sign 26) which is designed has a through-hole 28 (uniformly identified by reference sign 28), wherein the respective hole 26 is configured and designed in such a manner, and thus also dimensioned and matched to the screw 16, that the threaded section 20 forms a thread 30 (uniformly identified by reference sign 30) in the hole wall 32 (uniformly identified by reference sign 32) of the respective hole 26 (recognizable at the section of the lower housing part 6) when the respective screw 16 is inserted into the correspondingly provided hole 26. The respective hole 26 is therefore formed as a core hole for thread formation.

Figure 6:
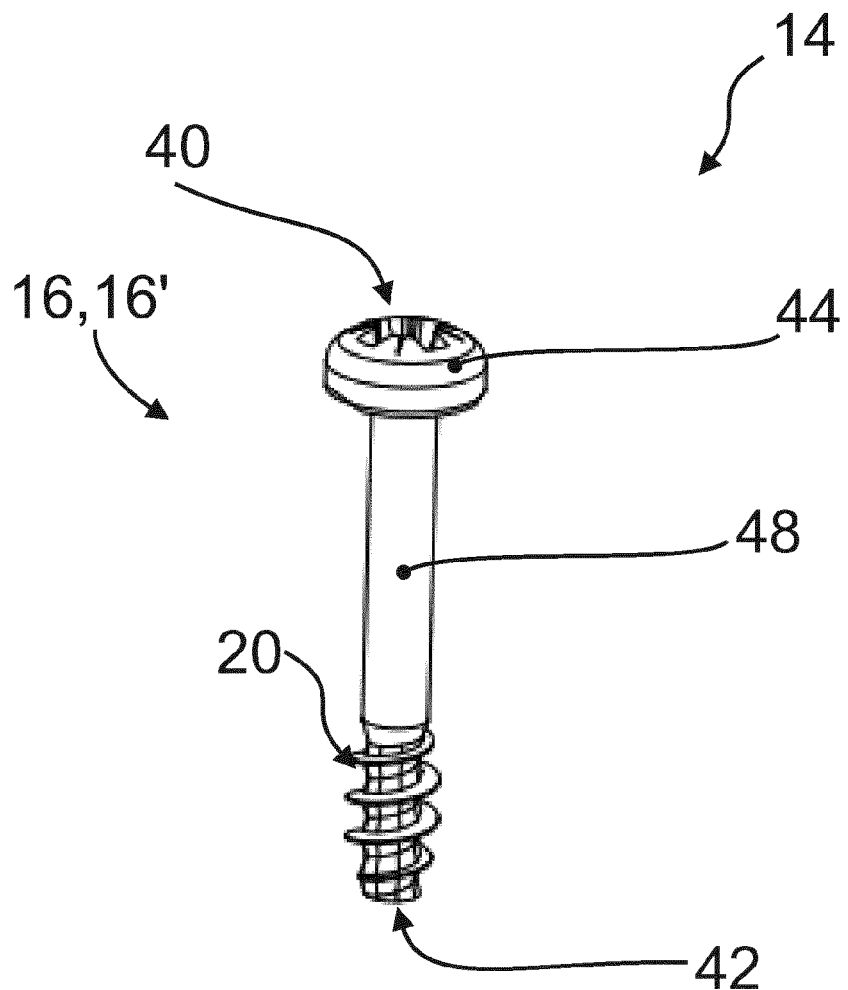
FIG. 6 shows one of the screws in a perspective view and in a schematic illustration, which screw serves to connect the upper housing part and the lower housing part to one another.

The respective screw 16 is inserted into a relevant connecting region 22, 24 by a rotational movement of the screw 16, which in this exemplary embodiment is produced by means of a screwdriver S via the screw head (see reference sign 44 in FIG. 6)

After the screwing process is completed, the screw 16 has formed a thread 30 by forming a thread in the hole wall 32 of the respective hole 30.

The length of the screw 16 is dimensioned such that, after completion of the screwing process, the free ends 40, 42 of the screw 16 do not project beyond the housing body 4. The length of the screw 16 results from the distance of its free ends 40, 42 from one another.

The screw head 44, which is located at one free end 40 of the screw 16, is recessed in a feed opening 46 to the hole 26 and is therefore concealed.

The respective feed opening 46 can be covered by a plug or a cover so that the screw head 44 is not visible from the outside of the housing body 4.

Furthermore, the length of the screw 16 is dimensioned such that, after completion of the screwing process, the free end 42 on which the threaded section 20 is located does not penetrate the connecting region 24 into which it is screwed, but the invention is not limited thereto.

The completion of the screwing process for all screws 16 indicates the end of the method according to the invention in which the housing body 4 is completed. Afterwards, components can still be attached to the housing body 4 in order to adapt it to the intended use.

FIG. 6 shows the screw 16 in a perspective view in a schematic representation with the threaded section 20 located at the one free end 42 of the screw 16.

The screw head 44 via which a rotational movement of the screw 16 is generated by means of the screwdriver S is located at the other free end 40 of the screw 16.

As can be seen in the representation, the screw 16 has a screw shank 48 which is formed between its screw head 44 and its threaded section 20 and which is thread-free, and the outer diameter of which is less than the core diameter of the threaded section 20. The screw 16 is therefore designed in this exemplary embodiment in the manner of a thin-shaft screw 16'.

The threaded section 20 has a greater strength and hardness than the relevant connecting region 20, 22 of the upper housing part 12 and the lower housing part 6 in order to ensure a secure screwing process and to be able to design the screw 16 in a wear-resistant manner or to reuse it several times.

In this case, the threaded section 20 is configured and designed for thread forming, as a result of which it forms a thread 30 as a groove in the relevant connecting region 22, 24 or by non-cutting deformation in the respective region of deformation 22, 24.

Figure 7:
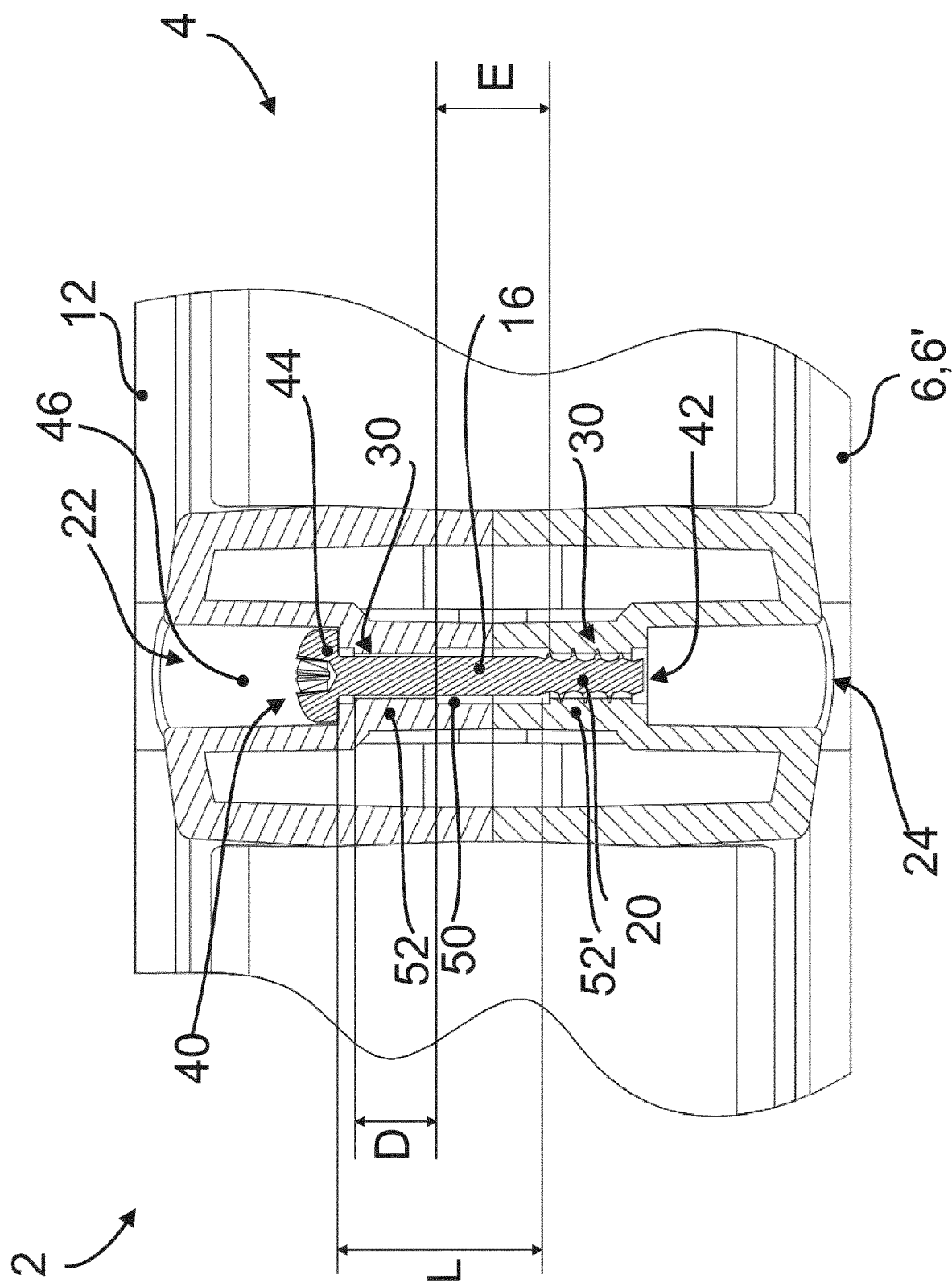
FIG. 7 shows the exemplary embodiment in a view according to FIG. 5 in order to clarify a provided cavity between the housing parts.

FIG. 7 shows the exemplary embodiment in a view according to FIG. 5. It can be seen that the upper housing part 12 and the lower housing part 6 are configured and designed in such a way that the mutually corresponding connecting regions 22, 24 each have a side 52, 52' (likewise visible in FIG. 3) which face one another in the connected state, and between which a thread clearance 50 is formed.

The thread clearance 50 initially leads to a secure connection between the housing parts 6, 12, as described in the introduction.

The thread clearance 50 also makes it possible for the threaded section 20 of the screw 16 to be arranged in an intermediate state in which the threaded section 20 is screwed through one of the connecting regions 22 and is not engaged with the other connecting region 24, thereby being captively held on one of the housing parts 6, 12 (in this exemplary embodiment on the upper housing part 12) when the housing parts 6, 12 are separated from each other.

FIG. 7 shows that the screw shank 48 has a length L, which in this embodiment is greater than the screwed-through section D of the connecting region 22, 24 for the screw 16.

The features shown and described with reference to the exemplary embodiment of an electronics housing 2 according to the invention shown in the figures are not bound thereto but can also form an electronics housing 2 according to the invention in another constellation of features.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An electronics housing for housing electronic components, comprising:
   a lower housing part and an upper housing part connected to one another by connecting means in order to form a housing body, the connecting means having at least one screw which has a threaded section configured for thread formation,
   wherein, when the housing body is in a connected state, the threaded section of the screw is screwed through a connecting region of the upper housing part to form thread, and screwed into a connecting region of the lower housing part to form thread at least in sections, or vice versa,
   wherein each connecting region has a through-hole having a screw section with a first circumference and a thread clearance with a second circumference larger than the first circumference, portions of each connecting region of the lower housing part that include the thread clearances abutting portions of each connecting region of the upper housing part that include the thread clearances when the claimed housing body is in the connected state, and
   wherein the threaded section of the screw forms thread at least partially circumferentially in the screw section of the through-hole, and no thread in the thread clearance of the through-hole, when the screw is inserted into the through-hole.

2. The electronics housing according to claim 1, wherein each through-hole is configured such that the corresponding threaded section forms thread at least partially circumferentially in a hole wall of the through-hole when the screw is inserted into the through-hole.

3. The electronics housing according to claim 1, wherein the threaded section is configured at least in sections for thread cutting.

4. The electronics housing according to claim 1, wherein the threaded section is configured at least in sections for thread forming.

5. The electronics housing according to claim 1, wherein the screw has a screw shank formed between a screw head of the at least one screw and the threaded section, an outer diameter of which screw shank is less than a nominal diameter comprising an edge diameter of the threaded section.

6. The electronics housing according to claim 5, wherein the screw shank has a length equal to or greater than a screwed-through section of the connecting region for the screw.

7. The electronics housing according to claim 1, wherein the threaded section tapers toward a free end of the screw.

8. The electronics housing according to claim 1, wherein the housing body, comprising the upper housing part and/or the lower housing part, comprises at least in sections an electrically insulating material, or a plastic, or a material having plastic.

9. The electronics housing according to claim 1, wherein the upper housing part and/or the lower housing part is/are formed integrally as one piece.

10. The electronics housing according to claim 1, wherein the housing body is shaped to be symmetrical, at least in sections, to at least one plane.

11. The electronics housing according to claim 1, wherein the upper housing upper part and the lower housing part are shaped alike.

12. The electronics housing according to claim 1, wherein the housing body is configured for mounting on a support rail.

13. The electronics housing according to claim 1, wherein a distance between the screw sections is greater than or equal to a length of the threaded section of the screw.

14. A method for housing electronic components by the electronics housing formed according to claim 1, comprising:
- connecting the lower housing part and the upper housing part to one another by connecting means in order to form the housing body,
- wherein the connecting means have at least one screw, the thread-forming threaded section of which
  a) is first screwed through the connecting region of the upper housing part to form thread,
  b) and thereupon is screwed into the connecting region of the lower housing part to form thread at least in sections.

15. The method for housing electronic components according to claim 14, wherein the screw, the thread-forming threaded section of which is configured to form thread at least in sections, is screwed into a hole of at least one connecting region.

* * * * *